United States Patent
Hosaka et al.

(10) Patent No.: US 10,192,774 B2
(45) Date of Patent: Jan. 29, 2019

(54) TEMPERATURE CONTROL DEVICE FOR PROCESSING TARGET OBJECT AND METHOD OF SELECTIVELY ETCHING NITRIDE FILM FROM MULTILAYER FILM

(71) Applicant: Tokyo Electron Limited, Tokyo (JP)

(72) Inventors: Yuki Hosaka, Miyagi (JP); Yoshihiro Umezawa, Miyagi (JP); Toshiki Nakajima, Miyagi (JP); Koichi Nagakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/509,522

(22) PCT Filed: Sep. 24, 2015

(86) PCT No.: PCT/JP2015/076923
§ 371 (c)(1),
(2) Date: Mar. 8, 2017

(87) PCT Pub. No.: WO2016/056391
PCT Pub. Date: Apr. 14, 2016

(65) Prior Publication Data
US 2017/0301579 A1 Oct. 19, 2017

(30) Foreign Application Priority Data

Oct. 9, 2014 (JP) .................................. 2014-207797
Jun. 2, 2015 (JP) .................................. 2015-112501

(51) Int. Cl.
*H01L 21/687* (2006.01)
*H01L 21/311* (2006.01)
*H01L 21/67* (2006.01)

(52) U.S. Cl.
CPC .. *H01L 21/68764* (2013.01); *H01L 21/31116* (2013.01); *H01L 21/67103* (2013.01);
(Continued)

(58) Field of Classification Search
None
See application file for complete search history.

(56) References Cited

U.S. PATENT DOCUMENTS 5,895,549 A * 4/1999 Goto ................. H01L 21/68742
118/503
6,485,248 B1 * 11/2002 Taylor, Jr. ......... H01L 21/67748
414/217
(Continued)

FOREIGN PATENT DOCUMENTS

JP 07-188915 A 7/1995
JP 11-272342 A 10/1999
(Continued)

OTHER PUBLICATIONS

International Search Report for PCT/JP2015/076923 dated Dec. 1, 2015.

*Primary Examiner* — Shamim Ahmed
(74) *Attorney, Agent, or Firm* — Pearne & Gordon LLP

(57) ABSTRACT

A temperature control device includes a moving stage allowed to be heated and configured to mount a processing target object on a top surface thereof; a cooling body allowed to be cooled and fixed at a position under the moving stage; a shaft, having one end connected to the moving stage, the other end positioned under the cooling body; a first flange provided at the other end; and a second flange provided between the first flange and the cooling body, extended between the one end and the other end; a driving plate, provided between the first flange and the second flange, having a top surface facing the second flange and a bottom surface opposite to the top surface; an elastic
(Continued)

body provided between the bottom surface of the driving plate and the first flange; and a driving unit configured to move the driving plate up and down.

6 Claims, 14 Drawing Sheets

(52) U.S. Cl.
CPC .. *H01L 21/67109* (2013.01); *H01L 21/67242* (2013.01); *H01L 21/68742* (2013.01)

(56) References Cited

U.S. PATENT DOCUMENTS

| | | | | |
|---|---|---|---|---|
| 6,576,151 | B1* | 6/2003 | Vereecke | H01L 21/31116 |
| | | | | 216/63 |
| 2002/0186967 | A1* | 12/2002 | Ramanan | H01L 21/67103 |
| | | | | 392/418 |
| 2003/0000775 | A1* | 1/2003 | Yudovsky | H01L 21/67748 |
| | | | | 187/250 |
| 2008/0110397 | A1 | 5/2008 | Son | |
| 2016/0379848 | A1* | 12/2016 | Yanagisawa | H01L 21/67069 |
| | | | | 156/345.26 |

FOREIGN PATENT DOCUMENTS

| | | |
|---|---|---|
| JP | 2002-043381 A | 2/2002 |
| JP | 3595150 B2 | 12/2004 |
| JP | 2006-190805 A | 7/2006 |

\* cited by examiner

TEMPERATURE CONTROL DEVICE FOR PROCESSING TARGET OBJECT AND METHOD OF SELECTIVELY ETCHING NITRIDE FILM FROM MULTILAYER FILM

CROSS-REFERENCE TO RELATED APPLICATION

This Application is a U.S. national phase application under 35 U.S.C. § 371 of PCT Application No. PCT/JP2015/076923 filed on Sep. 24, 2015, which claims the benefit of Japanese Patent Application Nos. 2014-207797 and 2015-112501 filed on Oct. 9, 2014 and Jun. 2, 2015, respectively, the entire disclosures of which are incorporated herein by reference.

TECHNICAL FIELD

The various embodiments described herein pertain generally to a temperature control device for a processing target object and a method of selectively etching a nitride film from a multilayer film.

BACKGROUND ART

In the manufacture of a semiconductor device, a processing target object may be etched by performing a process of cooling the processing target objet and a process of heating the processing target object alternately to form a fine pattern on the processing target object. In general, the cooling of the processing target object and the heating of the processing target object may be performed individually by using separate apparatuses. In this case of using the separate apparatuses for the cooling and the heating of the processing target object, the processing target object frequently needs to be transferred between the apparatus for heating the processing target object and the apparatus for cooling the processing target object. Resultantly, a processing throughput of the processing target object is reduced.

To suppress the reduction of the throughput, a device for performing the cooling and the heating of the processing target object in a single apparatus is being developed (see, for example, Patent Document 1). The device described in Patent Document 1 is equipped with a cooling plate, a heater plate and a moving pin. A flow path is formed within the cooling plate, and a temperature of the cooling plate is maintained at a low temperature by supplying a coolant into the flow path. The heater plate is provided with a thin film heater, and the processing target object is placed on a top surface of the heater plate. Further, a leading end of the moving pin is connected to the heater plate and is configured to move the heater plate in an up-and-down direction.

In this device, when heating the processing target object, the heater plate is moved upwards along with the moving pin to be spaced apart from the cooling plate. Then, by heating the heater plate with the thin film heater, the processing target object is heated. On the other hand, when cooling the processing target object, the heater plate is moved downwards along with the moving pin to be brought into contact with a top surface of the cooling plate. Accordingly, heat of the heater plate is absorbed by the cooling plate, so that the processing target object on the heater plate is cooled.

Patent Document 1: Japanese Patent No. 3,595,150

DISCLOSURE OF THE INVENTION

Problems to be Solved by the Invention

As stated above, the device described in Patent Document 1 controls the temperature of the processing target object by moving the heater plate up and down. In this device, however, since only one of the state where the heater plate and the cooling plate are in contact with each other by the tare weight thereof and the state where the heater plate and the cooling plate are spaced apart from each other can be selected, it is difficult to control the temperature of the processing target object accurately.

Thus, in the pertinent art, it has been required to provide a temperature control device capable of heating and cooling the processing target object while controlling the temperature of the processing target object with high accuracy.

Means for Solving the Problems

In one exemplary embodiment, there is provided a temperature control device for a processing target object. The temperature control device includes a moving stage allowed to be heated and configured to mount the processing target object on a top surface thereof; a cooling body allowed to be cooled and fixed at a position under the moving stage; a shaft, having one end connected to the moving stage; the other end positioned under the cooling body; a first flange provided at the other end; and a second flange provided between the first flange and the cooling body, extended between the one end and the other end; a driving plate, provided between the first flange and the second flange, having a top surface facing the second flange and a bottom surface opposite to the top surface; an elastic body provided between the bottom surface of the driving plate and the first flange; and a driving unit configured to move the driving plate up and down.

In this temperature control device, if the driving plate is moved upwards, the driving plate is brought into contact with the second flange, so that an upward force is applied to the moving stage. Accordingly, the moving stage is moved upwards to be spaced apart from the cooling body. As a result, the heat transfer between the moving stage and the cooling body is suppressed. By heating the moving stage while keeping the moving stage apart from the cooling body, the processing target object can be heated rapidly. If the driving plate is moved downwards, on the other hand, a downward force is applied to the moving stage via the elastic body. Accordingly, the moving stage is moved downwards and is brought into contact with the cooling body, so that the moving stage is cooled. Further, in this temperature control device, since the force exerted as the driving plate is moved downwards is applied to the moving stage via the elastic body, the contact pressure between the moving stage and the cooling body can be adjusted according to the amount of the downward movement of the driving plate. In the temperature control device according to the exemplary embodiment, by adjusting the contact pressure between the moving stage and the cooling body, the contact thermal resistance between the moving stage and the cooling body can be adjusted. Thus, by controlling the amount of the downward movement of the driving plate, the amount of the heat transfer between the moving stage and the cooling body can be adjusted. Therefore, according to the temperature control device of the exemplary embodiment, the temperature control can be performed accurately.

The elastic body may be a coil-shaped spring, and the spring may be configured to have a natural length or a length longer than the natural length when the driving plate is located at an uppermost position. Further, the driving unit may include a driving shaft extended in a vertical direction and connected to the driving plate; and a motor configured to move the driving shaft such that the driving plate is moved up and down.

The moving stage may include a heater. Further, a path for a coolant may be formed within the cooling body.

In another exemplary embodiment, there is provided a method of selectively etching a nitride film from a processing target object, which has a multilayer film in which an oxide film and the nitride film are alternately stacked on top of each other, by using the temperature control device as described above. The method includes placing the processing target object on the top surface of the moving stage; bringing the moving stage into contact with the cooling body by moving the driving plate downwards; etching the nitride film selectively from the multilayer film by plasma of a processing gas containing fluorine and hydrogen after the bringing of the moving stage into contact with the cooling body; spacing the moving stage apart from the cooling body by moving the driving plate upwards after the etching of the nitride film; and removing a reaction product, which is generated in the etching of the nitride film, by heating the moving stage after the spacing of the moving stage apart from the cooling body.

The method includes the process of etching the nitride film by cooling the processing target object and the process of removing the reaction product by heating the processing target object. By performing this method using the above-described temperature control device, the cooling and the heating of the processing target object can be performed in the same apparatus, so that the processing throughput can be improved. Furthermore, by performing the present method using the temperature control device, the processing target object can reach the target temperature in a short period when cooling the processing target object. Therefore, the processing throughput can be further improved.

Effect of the Invention

According to the exemplary embodiments, it is possible to perform the cooling and the heating of the processing target object while controlling the temperature of the processing target object accurately.

DETAILED DESCRIPTION

In the following, exemplary embodiments will be described in detail, and reference is made to the accompanying drawings, which form a part of the description.

Figure 1:
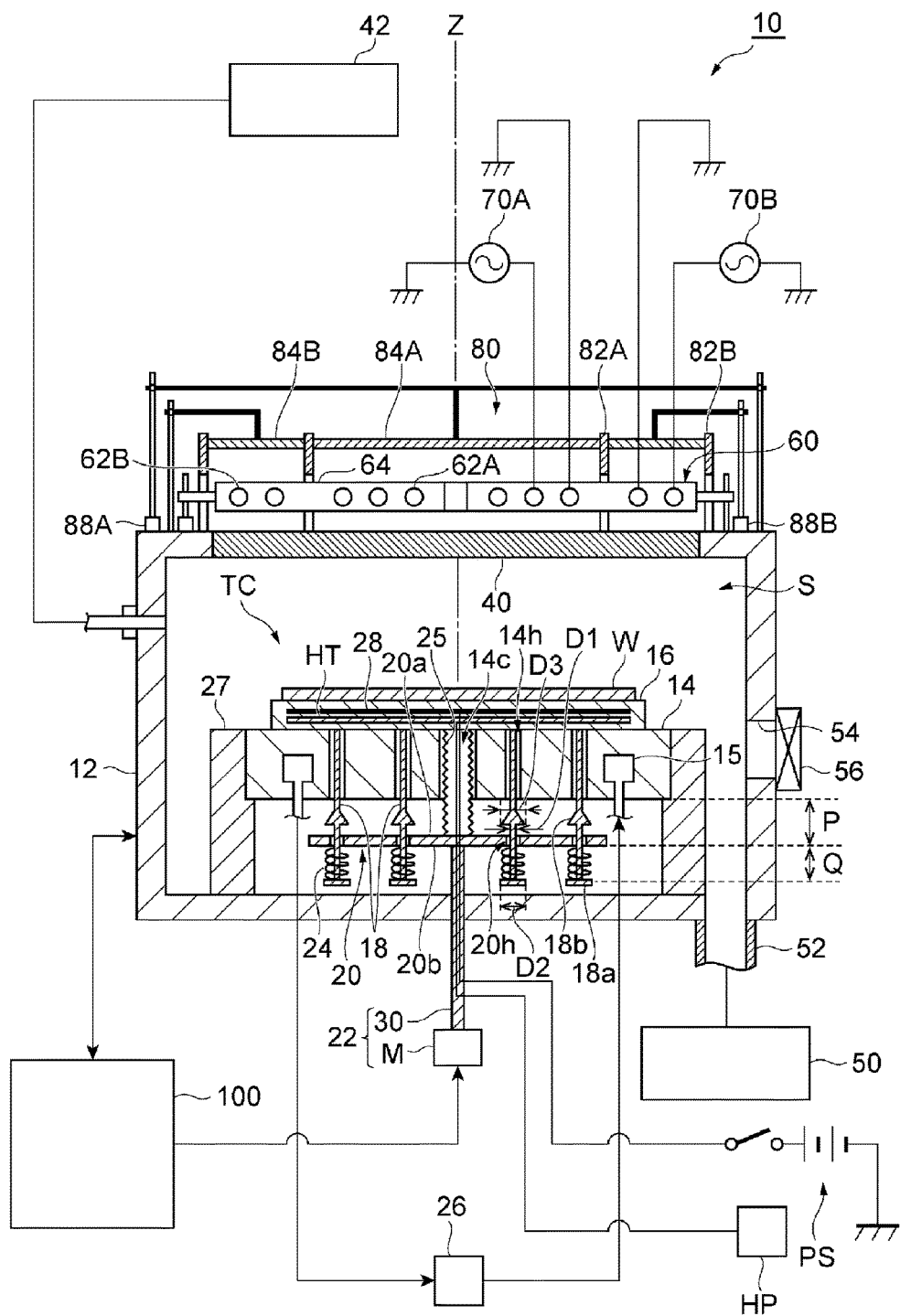
FIG. 1 is a cross sectional view schematically illustrating a plasma processing apparatus according to an exemplary embodiment.
Figure 2:
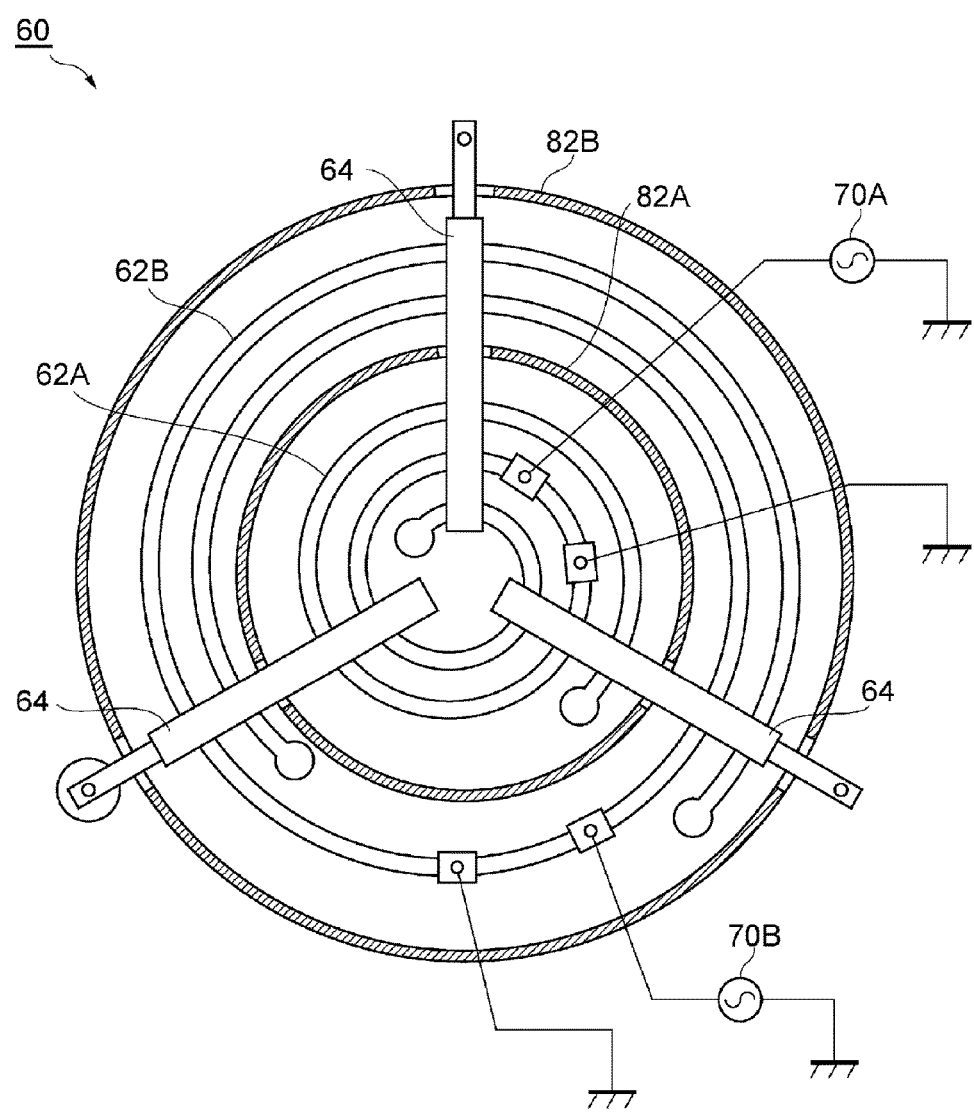
FIG. 2 is a plan view of a high frequency antenna of the plasma processing apparatus shown in FIG. 1.

First, referring to FIG. 1 and FIG. 2, a plasma processing apparatus equipped with a temperature control device according to an exemplary embodiment will be explained. FIG. 1 is a cross sectional view schematically illustrating the plasma processing apparatus according to the exemplary embodiment.

The plasma processing apparatus 10 is equipped with a processing vessel 12. The processing vessel 12 has a substantially cylindrical shape with respect to an axis line Z, and an internal space of the processing vessel 12 is formed as a processing space S. A temperature control device TC is provided in a lower portion of the processing vessel. The temperature control device TC is configured to hold a processing target object W and cool or heat the processing target object W selectively. Details of the temperature control device TC will be elaborated.

A plate-shaped dielectric member 40 is provided at a ceiling portion of the processing vessel 12. The plate-shaped dielectric member 40 is made of, by way of non-limiting example, quartz glass or ceramic, and is disposed to face a moving stage 16 of the temperature control device TC to be described later. The plate-shaped dielectric member 40 is formed to have a disk shape and is hermetically provided at the ceiling portion of the processing vessel 12 to close an opening formed in the ceiling portion of the processing vessel 12.

A gas supply unit 42 is connected to the processing vessel 12. The gas supply unit 42 is configured to supply a gas into the processing space S. To elaborate, the gas supply unit 42 supplies a gas containing fluorine (F) and hydrogen (H). Further, the gas supply unit 42 may supply a nitrogen gas $N_2$ into the processing vessel S. Further, the gas supply unit 42 may supply an oxygen gas $O_2$ or an argon gas Ar into the processing vessel S.

A gas exhaust unit 50 configured to exhaust an atmosphere within the processing vessel 12 is connected to a bottom portion of the processing vessel 12 via a gas exhaust line 52. The gas exhaust unit 50 is implemented by, for example, a vacuum pump and is configured to decompress the inside of the processing vessel 12 to a desired pressure.

A wafer carry-in/out opening 54 is formed at a sidewall portion of the processing vessel 12, and a gate valve 56 is provided at the wafer carry-in/out opening 54. For example, when the processing target object W is carried into the processing vessel 12, the gate valve 56 is opened, and the processing target object W is placed on the moving stage 16 within the processing vessel 12. Then, the gate valve 56 is closed, and the processing target object W is processed.

A high frequency antenna 60 having a planar shape and a shield member 80 configured to cover the high frequency antenna 60 are provided at the ceiling portion of the processing vessel 12. The high frequency antenna 60 is disposed to face a top surface (outer surface) of the plate-shaped dielectric member 40. FIG. 2 is a plan view of the high frequency antenna 60. Mainly, the high frequency antenna 60 includes an inner antenna element 62A provided to correspond to a central portion of the plate-shaped dielectric member 40 and an outer antenna element 62B provided to cover an outer periphery of the plate-shaped dielectric member 40. Each of the inner antenna element 62A and the outer antenna element 62B may be formed to have a spiral coil shape made of, by way of non-limiting example, a conductor such as copper, aluminum or stainless steel.

The inner antenna element 62A and the outer antenna element 62B are held as a single body by a plurality of holding members 64. For example, each holding member 64 has a rod shape, as illustrated in FIG. 2. These holding members 64 are arranged in a radial shape from the vicinity of a center of the inner antenna element 62A to be protruded toward the outer antenna element 62B. FIG. 2 shows an illustrative example where the inner antenna element 62A and the outer antenna element 62B are held by three holding members 64.

The shield member 80 has a cylindrical inner shield wall 82A provided between the antenna elements 62A and 62B to surround the inner antenna element 62A; and a cylindrical outer shield wall 82B surrounding the outer antenna element 62B. In this configuration, the top surface of the plate-shaped dielectric member 40 is divided into a central portion (central zone) inside the inner shield wall 82A and a peripheral portion (peripheral zone) between the shield walls 82A and 82B.

A disk-shaped inner shield plate 84A is placed above the inner antenna element 62A to close an opening of the inner shield wall 82A. A donut-shaped outer shield plate 84B is placed above the outer antenna element 62B to close an opening between the shield walls 82A and 82B. Further, the inner shield plate 84A and the outer shield plate 84B are configured to be height-adjustable by actuators 88A and 88B, respectively.

The antenna elements 62A and 62B are respectively connected to high frequency power supplies 70A and 70B. Accordingly, it is possible to apply high frequency powers of same frequency or different frequencies to the inner antenna element 62A and the outer antenna element 62B. If a high frequency power having a required frequency (e.g., 40 MHz) is applied to the inner antenna element 62A from the high frequency power supply 70A at a required power level, a gas introduced into the processing vessel 12 is excited by an induction field which is formed within the processing vessel 12, so that donut-shaped plasma is generated at a central portion above the processing target object W.

Further, if a high frequency power having a required frequency (e.g., 60 MHz) is applied to the outer antenna element 62B from the high frequency power supply 70B at a required power level, a gas introduced into the processing vessel 12 is excited by an induction field which is formed within the processing vessel 12, so that another donut-shaped plasma is generated at a peripheral portion above the processing target object W.

Now, the temperature control device TC will be elaborated. The temperature control device TC is used to control the temperature of the processing target object. The temperature control device TC is equipped with a cooling body 14, the moving stage 16, a shaft 18, a driving plate 20, a driving unit 22 and an elastic body 24.

The moving stage 16 has a substantially disk shape, and is provided within the processing vessel 12. The moving stage 16 is configured to be moved in a direction away from the cooling body 14 and in a direction toward the cooling body 14, that is, is configured to be moved up and down along with a movement of the driving plate 20 in an up-and-down direction as will be described later. According to the exemplary embodiment, the moving stage 16 includes an electrode 28 which is implemented by a conductive film, and has a structure in which the electrode 28 is embedded between a pair of insulating layers or insulating sheets. The electrode 28 is electrically connected to a DC power supply PS. In the exemplary embodiment, the moving stage 16 serves as an electrostatic chuck configured to attract and hold the processing target object W by a Coulomb force generated by a DC voltage from the DC power supply PS.

Further, a heater HT as a heating element may be embedded in the moving stage 16. This heater HT is electrically connected with a heater power supply HP. Further, the heater HT may not be buried within the moving stage 16 as long as it is capable of heating the moving stage 16. The heater HT may be implemented by, for example, a thin film heater firmly contacted to a surface of the moving stage 16, a radiant heater configured to heat the moving stage by radiating an infrared ray from above the moving stage 16, or the like. This heater HT is configured to heat the temperature of the moving stage 16 to a first temperature by a power supplied from the heater power supply HP. The first temperature is higher than a second temperature to be described later and is, for example, 200° C. As stated above, the moving stage 16 is configured to be heated.

The cooling body 14 is provided under the moving stage 16. The cooling body 14 has a substantially disk shape, and is fixed under the moving stage 16 within the processing vessel 12. To hold the cooling body 14 in place, the plasma processing apparatus 10 is further equipped with a cylindrical supporting member 27. The cylindrical supporting member 27 is provided in the lower portion of the processing vessel 12, and supports the cooling body 14 by being in contact with a side surface of the cooling body 14 and an outer periphery portion of a bottom surface of the cooling body 14. The cooling body 14 is used to cool the moving stage 16 by taking heat from the moving stage 16 which is in contact with a top surface of the cooling body 14.

Further, a coolant path 15 is formed within the cooling body 14, and a coolant inlet line and a coolant outlet line are connected to the coolant path 15. The coolant inlet line and the coolant output line are connected to a chiller unit 26. The chiller unit 26 cools a coolant to the second temperature and supplies the coolant into the coolant path 15 through the coolant inlet line. The second temperature is lower than the first temperature and is, for example, −50° C. The coolant supplied into the coolant path 15 is circulated to be returned back into the chiller unit 26 through the coolant outlet line.

As stated above, by circulating the coolant through the coolant path 15, the cooling body 14 can be cooled to the second temperature.

Further, a through hole 14c is formed through the cooling body 14 along the axis line Z, and an extensible/contractible cylindrical bellows 25 is provided within the through hole 14c. One end of the bellows 25 is connected to a bottom surface of the moving stage 16, and the other end of the bellows 25 is connected to a top surface of the driving plate 20. The bellows 25 provides a space through which a wiring connecting the heater HT and the heater power supply HP and a wiring connecting the electrode 28 and the DC power supply PS are inserted.

Further, the cooling body 14 is also provided with, at outer positions than the through hole 14c in a radial direction, a plurality of through holes 14h extended through the cooling body 14 in a thickness direction thereof. The shaft 18 is inserted into each of the through holes 14h. In the example shown in FIG. 1, the cooling body 14 has the plurality of through holes 14h, and the temperature control device TC includes a plurality of shafts 18 each of which is inserted into the corresponding one of the through holes 14h. However, the exemplary embodiment is not limited to this example configuration. That is, the cooling body 14 may be provided with a single through hole 14h, and the temperature control device TC may have a single shaft 18 which is inserted into the single through hole 14h. Hereinafter, an example where the temperature control device TC has the plurality of shafts 18 will be explained.

The shafts 18 are connected to the moving stage 16. To elaborate, each shaft 18 has one end (top end) and the other end (bottom end). The one end of each shaft 18 is connected to the bottom surface of the moving stage 16. Further, each shaft 18 is vertically extended below the driving plate 20 through the corresponding one of the through holes 14h. Accordingly, the other end of each shaft 18 is located under the driving plate 20.

Each shaft 18 is provided with a first flange 18a and a second flange 18b. The first flange 18a has a flat plate shape, for example, and is provided at the other end of the shaft 18. The second flange 18b has, for example, a conical shape. The second flange 18b is provided at a position between the one end and the other end of the shaft 18 and between the first flange 18a and the cooling body 14. The first flange 18a and the second flange 18b are protruded more than the other portion of the shaft 18 in a direction orthogonal to a lengthwise direction of the shaft 18, i.e., in the radial direction. To elaborate, a diameter of the shaft 18 at a portion between the one end and the second flange 18b and at a portion between the second flange 18b and the first flange 18a is D1. Further, the first flange 18a has a diameter of D2, and the second flange 18b has a diameter of D3. The diameter D2 and the diameter D3 are set to be larger than the diameter D1. Further, the diameter D1 is set to be smaller than a diameter of each through hole 14h and a diameter of each through hole 20h to be described later. Meanwhile, the diameter D2 and the diameter D3 are set to be larger than the diameter of each through hole 14h and the diameter of each through hole 20h to be described later.

The driving plate 20 is provided between the first flange 18a and the second flange 18b. The driving plate 20 has a substantially disk shape, and is located under the cooling body 14. The driving plate 20 has a top surface 20a which faces the second flange 18b; and a bottom surface 20b opposite to the top surface 20a. The driving plate 20 is placed such that the top surface 20a faces the bottom surface of the cooling body 14. Further, the driving plate 20 is provided with the aforementioned multiple through holes 20h which are extended through the driving plate 20 in a thickness direction thereof. The through holes 20h are formed at positions facing the corresponding through holes 14h formed through the cooling body 14. The portion of the shaft 18 between the first flange 18a and the second flange 18b is inserted into each of the multiple through holes 20h.

The driving plate 20 is connected to the driving unit 22. The driving unit 22 includes a driving shaft 30 and a motor M. The driving shaft 30 is vertically extended along the axis line Z. One end (top end) of the driving shaft 30 is connected to the driving plate 20. Further, the other end (bottom end) of the driving shaft 30 is connected to the motor M. The motor M applies a driving force for moving the driving shaft 30 in a direction of the axis line Z, i.e., the up-and-down direction, to the driving shaft 30. The driving shaft 30 may be implemented by, for example, but not limitation, a ball screw, and is configured to be moved in the direction of the axis line Z by converting a rotary motion of the motor M into a linear movement in the direction of the axis line Z. As stated above, the driving unit 22 moves the driving plate 20 in the direction of the axis line Z, i.e., the up-and-down direction. Further, a distance P between the bottom surface of the cooling body 14 and the bottom surface 20b of the driving plate 20 and a distance Q between the bottom surface 20b of the driving plate 20 and the first flange 18a shown in FIG. 1 are varied as the driving plate 20 are moved upwards and downwards.

The elastic body 24 is provided between the bottom surface 20b of the driving plate 20 and the first flange 18a. As an example, the elastic body 24 is a cylindrical coil-shaped spring. In the present exemplary embodiment, the elastic body 24 is disposed coaxially with the shaft 18. Further, the elastic body 24 is not limited to the spring as long as it is made of an elastic material. If the driving plate 20 is lowered, the elastic body 24 is elastically deformed in a compressed direction between the bottom surface 20b of the driving plate 20 and the first flange 18a. If the elastic body 24 is compressed, the elastic body 24 generates a reaction force which presses the first flange 18a downwards. As a result, a force toward the cooling body 14 (i.e., a downward force) is transferred to the moving stage 16 via the shaft 18.

According to the exemplary embodiment, the plasma processing apparatus 10 may further include a control unit 100 configured to control individual components of the plasma processing apparatus 10 including the temperature control device TC. The control unit 100 may be a controller such as a programmable computer device. The control unit 100 may control the individual components of the plasma processing apparatus 10 according to a program based on a recipe. By way of example, the control unit 100 transmits a control signal to the motor M of the driving unit 22 and controls a position of the driving plate 20 in the up-and-down direction. Furthermore, the control unit 100 may send control signals to the high frequency power supply 70A, the high frequency power supply 70B, the gas exhaust unit 50 and the gas supply unit 42 to control a power supplied to the inner antenna element 62A, a power supplied to the outer antenna element 62B, a pressure within the processing vessel 12, and a kind and a flow rate of a gas supplied into the processing vessel 12. In addition, the control unit 100 may send a control signal to the heater power supply HP to adjust the temperature of the heater HT. As stated above, the control unit 100 controls the individual components of the plasma processing apparatus 10 according to a processing recipe such that a required processing is performed by the plasma processing apparatus 10.

Figure 3:
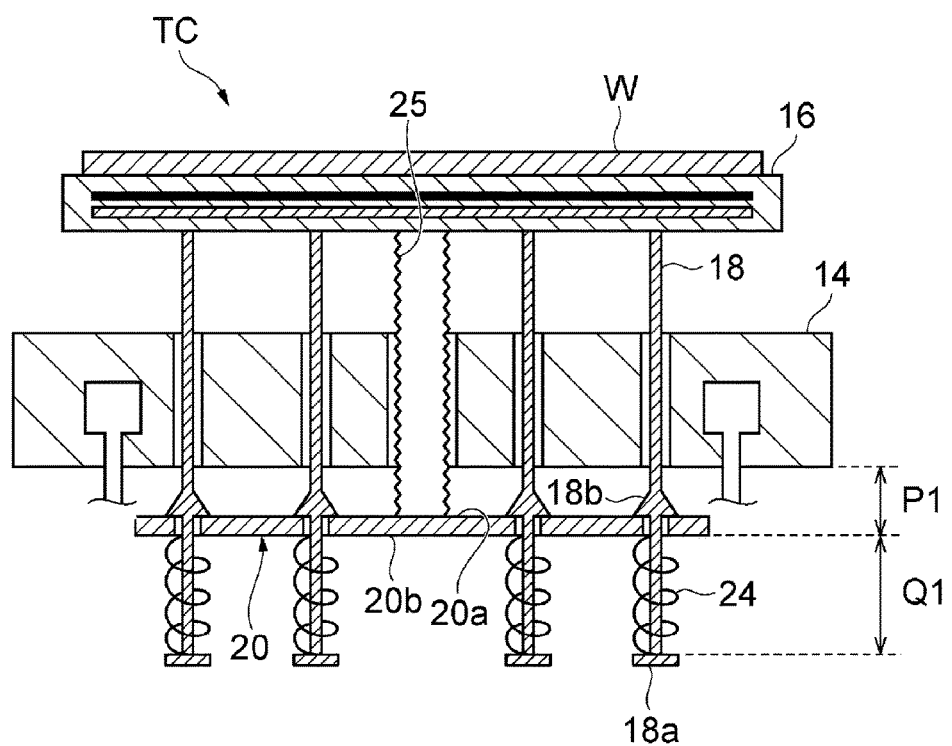
FIG. 3 is a diagram for describing an operation of a temperature control device.
Figure 4:
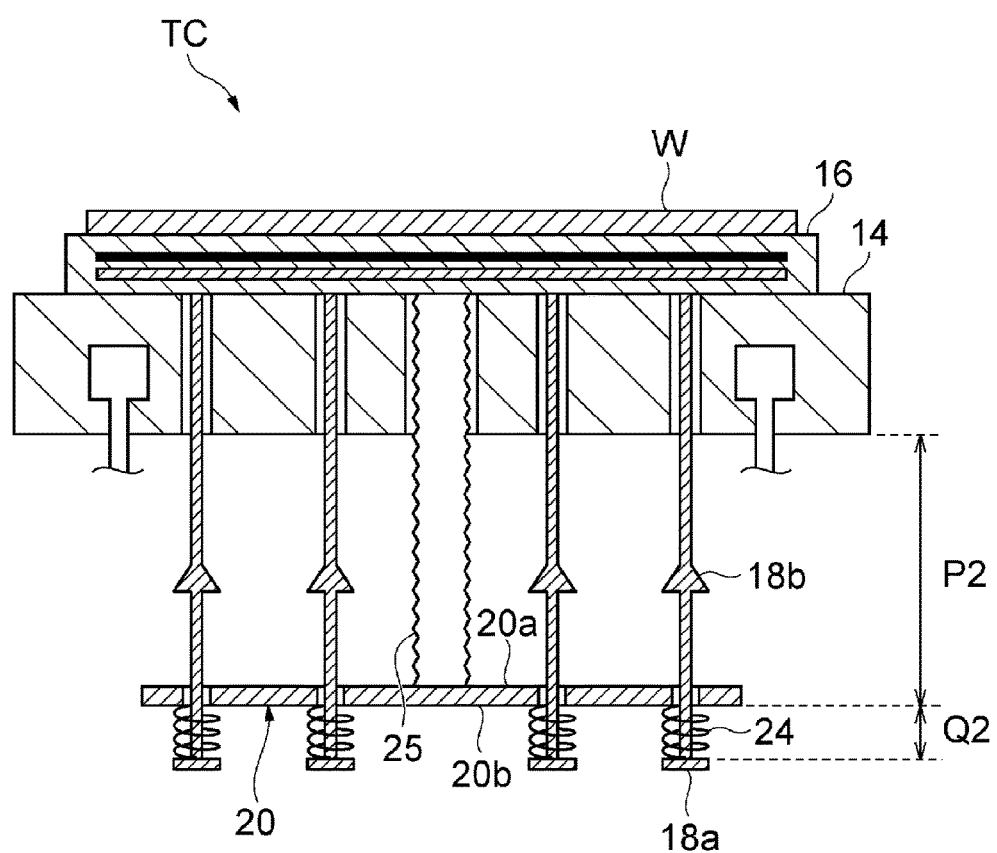
FIG. 4 is a diagram for describing an operation of the temperature control device.

Now, referring to FIG. 3 and FIG. 4, an operation of the temperature control device according to the exemplary embodiment will be explained. FIG. 3 is a diagram for describing an operation of the temperature control device TC when heating the processing target object W placed on the top surface of the moving stage 16. FIG. 4 is a diagram for describing an operation of the temperature control device TC when cooling the processing target object W placed on the top surface of the moving stage 16.

As depicted in FIG. 3, when heating the processing target object W, the driving plate 20 of the temperature control device TC is first moved upwards. Accordingly, the top surface 20a of the driving plate 20 is brought into contact with the second flange 18b, and a force which moves the moving stage 16 upwards is delivered to the moving stage 16 via the shaft 18. As a result, the moving stage 16 is moved upwards to be spaced apart from the cooling body 14. In this state, as shown in FIG. 3, a distance P1 between the bottom surface of the cooling body 14 and the bottom surface 20b of the driving plate 20 becomes smaller than the distance P between the bottom surface of the cooling body 14 and the bottom surface 20b of the driving plate 20 shown in FIG. 1. Meanwhile, a distance Q1 between the bottom surface 20b of the driving plate 20 and the first flange 18a becomes larger than the distance Q between the bottom surface 20b of the driving plate 20 and the first flange 18a shown in FIG. 1. At this time, the bellows 25 is extended in the direction of the axis line Z, and both ends of the bellows 25 are moved following the movements of the moving stage 16 and the driving plate 20.

Subsequently, while maintaining the state where the moving stage 16 is distanced apart from the cooling body 14, the moving stage 16 is heated by the heater HT. As shown in FIG. 3, in the state that the moving stage 16 is raised from the cooling body 14, the moving stage 16 is spaced apart from the cooling body 14 with a space therebetween. Accordingly, in this state, a heat flux heading toward the cooling body 14 from the moving stage 16 can be blocked. Particularly, since the space between the moving stage 16 and the cooling body 14 is turned into a vacuum during a plasma processing, a heat exchange between the moving stage 16 and the cooling body 14 can be substantially suppressed.

Meanwhile, when cooling the processing target object W, the driving plate 20 of the temperature control device TC is moved downwards, as illustrated in FIG. 4. Accordingly, the bottom surface 20b of the driving plate 20 presses down the elastic body 24, and the elastic body 24 is compressed between the driving plate 20 and the first flange 18a, and a force which moves the moving stage 16 downwards is applied to the moving stage 16 via the shaft 18. As a result, the moving stage 16 is moved downwards to be brought into contact with the cooling body 14. In this state, as shown in FIG. 4, a distance P2 between the bottom surface of the cooling body 14 and the bottom surface 20b of the driving plate 20 becomes larger than the distance P between the bottom surface of the cooling body 14 and the bottom surface 20b of the driving plate 20 shown in FIG. 1. Meanwhile, a distance Q2 between the bottom surface 20b of the driving plate 20 and the first flange 18a becomes smaller than the distance Q between the bottom surface 20b of the driving plate 20 and the first flange 18a shown in FIG. 1.

Here, a contact pressure, which depends on the position of the driving plate 20, is generated between the bottom surface of the moving stage 16 and the top surface of the cooling body 14. To elaborate, as the amount of the downward movement of the driving plate 20 is increased, the amount of compression of the elastic body 24, i.e., elastic energy of the elastic body 24 is increased. Accordingly, with the increase of the amount of the downward movement of the driving plate 20, the force pressing the moving stage 16 against the cooling body 14 is increased, so that the contact pressure between the moving stage 16 and the cooling body 14 is increased.

While the moving stage 16 and the cooling body 14 are in contact with each other, heat is transferred from the moving stage 16 to the cooling body 14. Here, the amount of the heat transfer depends on a contact thermal resistance between the moving stage 16 and the cooling body 14. The contact thermal resistance is an index which indicates the degree of difficulty of the heat transfer between two objects in contact, and depends on a surface roughness of a contact surface, a material of the object, a contact pressure, a material existing between the objects, etc. Thus, in the temperature control device TC, by adjusting the amount of the downward movement of the driving plate 20, the contact thermal resistance between the moving stage 16 and the cooling body 14 can be adjusted. To elaborate, as the amount of the downward movement of the driving plate 20 is increased, the contact thermal resistance between the moving stage 16 and the cooling body 14 is reduced.

Furthermore, when heating the processing target object W by operating the temperature control device TC as illustrated in FIG. 3 or when cooling the processing target object W by operating the temperature control device TC as shown in FIG. 4, the processing target object W may be electrostatically attracted to and held by the moving stage 16 by applying a voltage to the electrode 28 of the moving stage 16. By allowing the processing target object W to be attracted to and held by the moving stage 16 electrostatically, the contact pressure between the processing target object W and the moving stage 16 can be enhanced. Therefore, the processing target object W can be heated or cooled in a shorter period of time.

Now, a relationship between the contact thermal resistance and a time required for the temperature of the processing target object to reach a target temperature will be discussed. To describe this relationship, a numerical model including the cooling body 14 made of an aluminum member having a diameter of 300 mm and a thickness of 5 mm and the moving stage 16 made of a silicon carbide (SiC) having a diameter of 300 mm and a thickness of 5 mm is designed. Then, through the numerical analysis, a variation of the temperature of the processing target object W placed on the top surface of the moving stage 16 with a lapse of time is obtained at the time of bringing the cooling body 14 and the moving stage 16 of this model into contact with each other. In this numerical analysis, a silicon wafer having a diameter of 300 mm is used as the processing target object W. Furthermore, in this numerical analysis, the contact thermal resistance ($m^2 \cdot K/W$) between the cooling body 14 and the moving stage 16 is changed in various ways as a parameter.

Figure 5A:
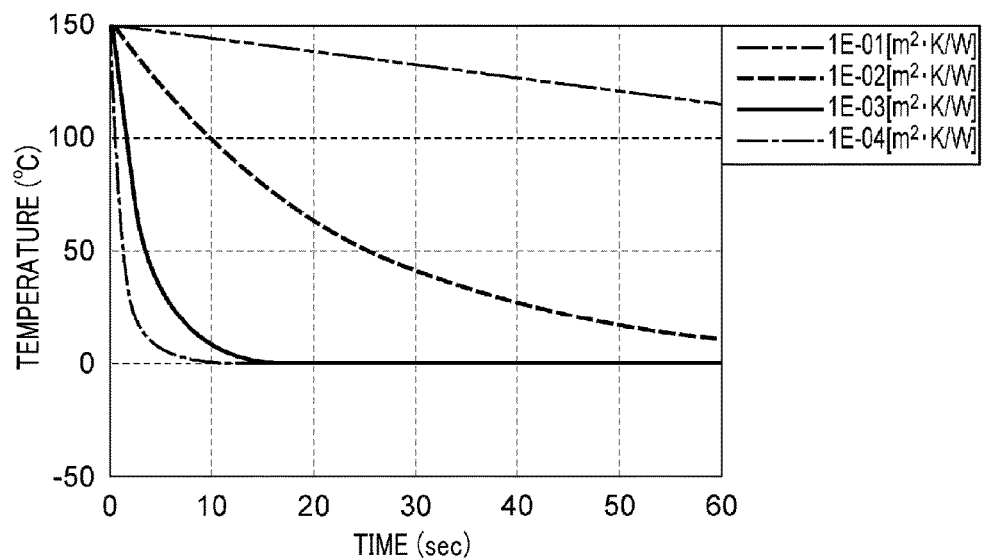
FIG. 5A and FIG. 5B present numerical analysis results showing a variation in a temperature of a moving stage with a lapse of time when the moving stage and a cooling body 14 are brought into contact with each other.
Figure 5B:
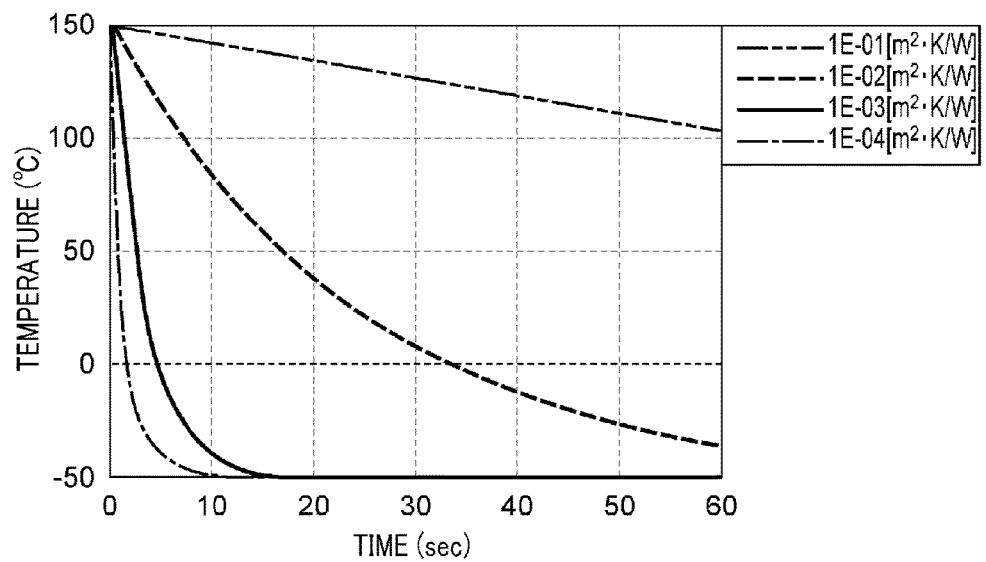

FIG. 5A shows a result of the numerical analysis when an initial temperature of the moving stage 16 is set to be 150° C. and a temperature of the cooling body 14 is set to be 0° C. FIG. 5B provides a result of the numerical analysis when the initial temperature of the moving stage 16 is set to be 150° C. and the temperature of the cooling body 14 is set to be −50° C.

As depicted in FIG. 5A and FIG. 5B, it is observed that the processing target object W is cooled in a short time as the contact thermal resistance between the moving stage 16 and the cooling body 14 is decreased regardless of the temperature of the cooling body 14. From this result, it is confirmed that the heat exchange amount per unit time can be increased as the contact pressure between the moving stage 16 and the cooling body 14 is increased, thus enabling the substrate to be cooled in a short time. Thus, it is found out that the temperature control device TC configured to adjust the contact pressure between the moving stage 16 and the cooling body 14 is capable of cooling the processing target object W in a short time.

As for this temperature control device TC, there may be assumed various configuration examples according to the position of the driving plate 20 when the bottom surface of the moving stage 16 is spaced apart from the top surface of the cooling body 14 and connection or disconnection between the driving plate 20 and the spring. These configuration examples of the temperature control device TC show unique relationships between the position of the driving plate 20 and the contact thermal resistance. That is, a relationship between the position of the driving plate 20 and the contact thermal resistance in any of the configuration examples of the temperature control device TC is different from a relationship between the position of the driving plate 20 and the contact thermal resistance in another configuration example. Hereinafter, parameters which need to be defined to describe the relationship between the position of the driving plate 20 and the contact thermal resistance in these configuration examples will be first discussed.

Figure 6:
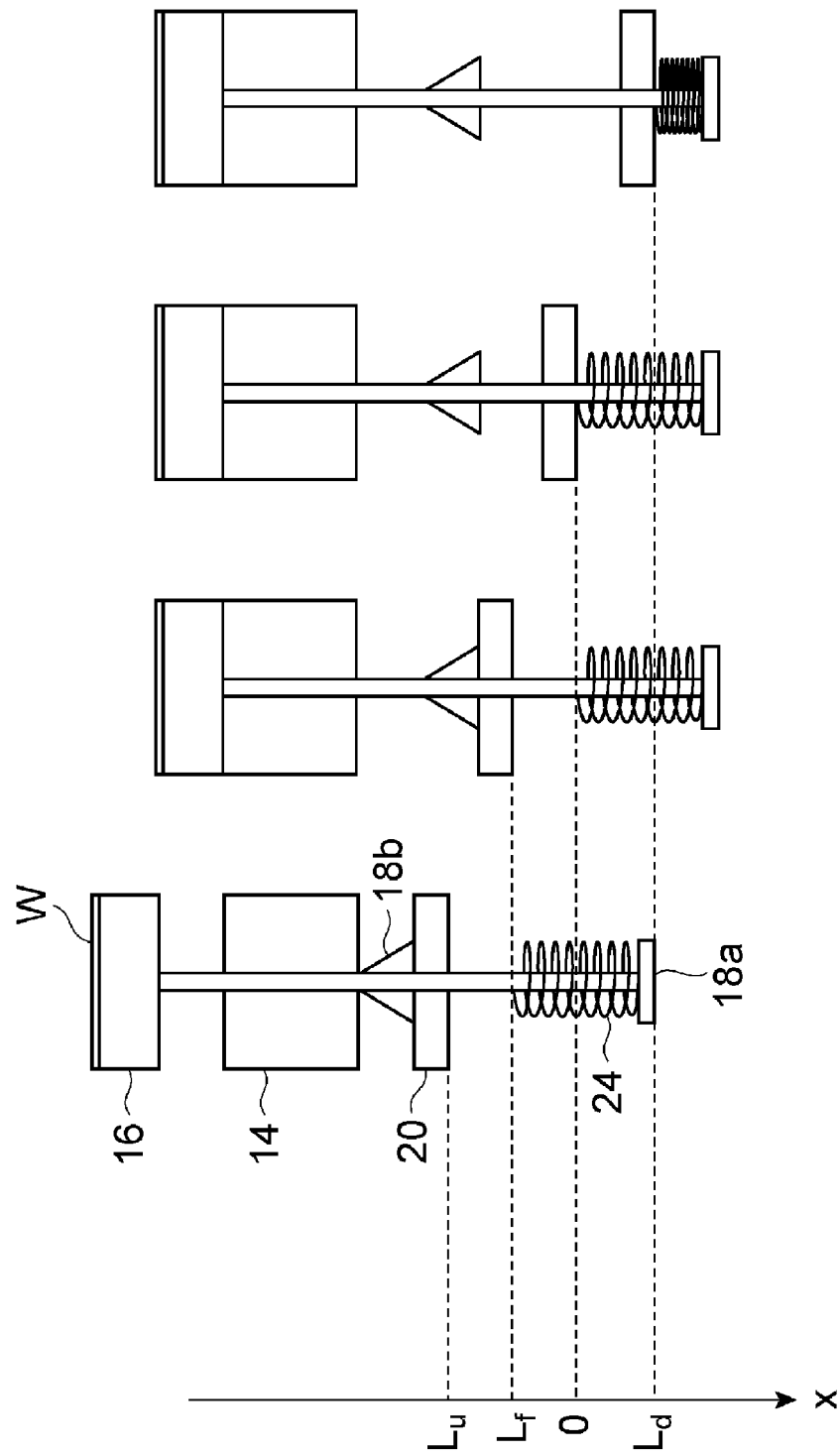
FIG. 6 is a diagram for describing a position of a driving plate.

FIG. 6 is a diagram for describing the position of the driving plate 20. In FIG. 6, the position of the driving plate 20 in the up-and-down direction is indicated as a parameter x. As shown in FIG. 6, the driving plate 20 is located at a position of x=0 when the position of the bottom surface of the driving plate 20 and the position of the upper end of the elastic body 24 having a natural length are coincident. Further, when the driving plate 20 is located under the position of x=0, the driving plate 20 is located at a position of x>0. Furthermore, when the driving plate 20 is located above the position of x=0, the driving plate 20 is located at a position of x<0.

Further, a position $L_u$ on the x-axis represents a movement limit position (uppermost position) of the driving plate 20 in the upward direction, and a position $L_d$ indicates a movement limit position (lowermost position) of the driving plate 20 in the downward direction. Furthermore, a position $L_f$ on the x-axis indicates a position of the driving plate 20 at the moment when the bottom surface of the moving stage 16 is spaced apart from the top surface of the cooling body 14 by moving the driving plate 20 upwards from below. Further, k denotes an elastic modulus (e.g., a spring constant) of the elastic body 24; m, a mass of the moving stage 16; and a, a coefficient indicating a variation ratio of the contact thermal resistance with respect to a load applied upon the cooling body 14 from the moving stage 16. Below, four difference configuration examples of the temperature control device will be explained by using these parameters.

Configuration Example 1

Figure 7A:
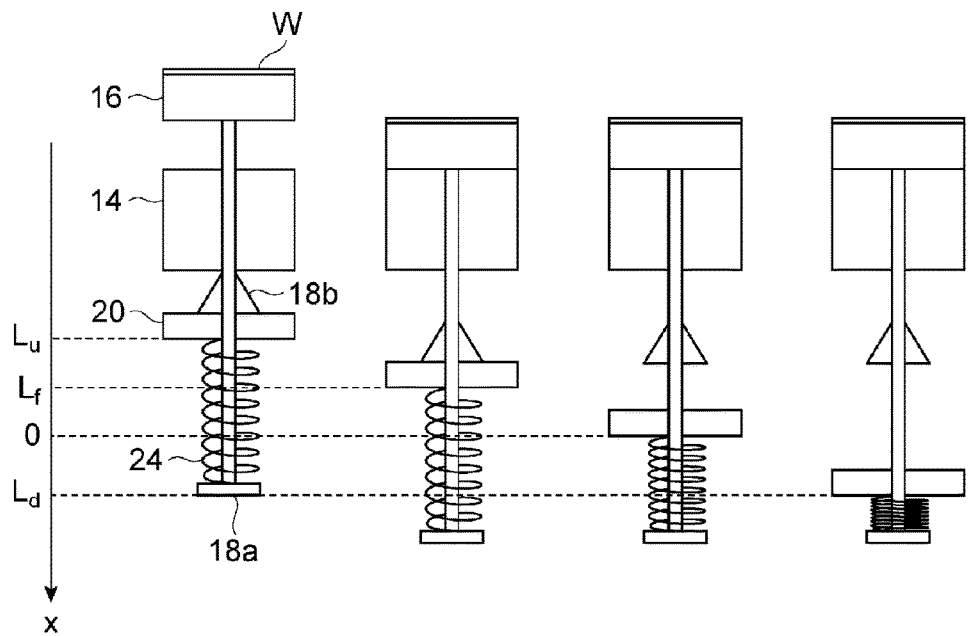
FIG. 7A is a diagram for describing a position of the driving plate in a configuration example 1 and FIG. 7B is a diagram showing a relationship between a contact thermal resistance and the position of the driving plate in the temperature control device of the configuration example 1.

In a configuration example 1, the temperature control device TC is designed such that the upper end of the elastic body 24 is connected to the bottom surface 20b of the driving plate 20 and the position $L_f$ is equal to or less than zero (0) ($L_f \leq 0$). FIG. 7A is a schematic diagram illustrating states of the moving stage 16, the shaft 18 and the elastic body 24 when the driving plate 20 is located at the positions $L_u$, $L_f$, 0 and $L_d$ on the x-axis in the temperature control device of the configuration example 1. In this configuration example 1, the elastic body 24 is configured to have a natural length or a length larger than the natural length when x<0 (e.g., when the driving plate is located at the uppermost position).

Figure 7B:
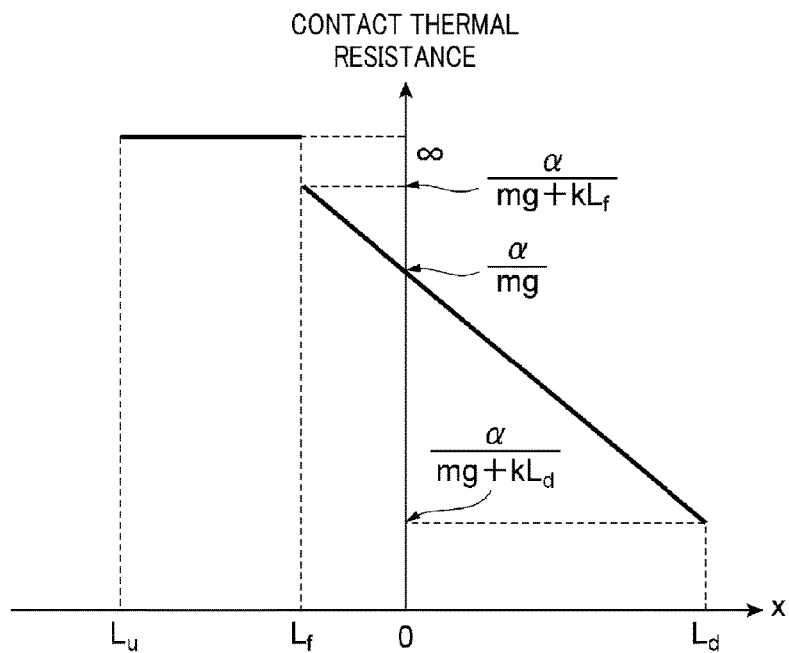

FIG. 7B shows a relationship between the position of the driving plate 20 and the contact thermal resistance in the configuration example 1. As depicted in FIG. 7A, in the configuration example 1, in case that the driving plate 20 is located at a position of $L_u \leq x < L_f$, the moving stage 16 is distanced apart from the cooling body 14. Accordingly, when the driving plate 20 is located at the position of $L_u \leq x < L_f$, the contact thermal resistance between the moving stage 16 and the cooling body 14 is substantially infinite as shown in FIG. 7B.

Further, in case that the driving plate 20 is located at a position of $L_f \leq x < L_d$, the elastic body 24 is elastically deformed, and a contact pressure dependent on the position of the driving plate 20 is generated between the moving stage 16 and the cooling body 14. This contact pressure is expressed as $m \cdot g + k \cdot x [Pa/m^2]$. Accordingly, when the driving plate 20 is located within the range of $L_f \leq x < L_d$, the contact thermal resistance between the moving stage 16 and the cooling body 14 is expressed as $\alpha/(m \cdot g + k \cdot x)[K/W]$.

As can be seen from FIG. 7B, in the configuration example 1, the contact thermal resistance between the moving stage 16 and the cooling body 14 can be linearly controlled within a range from $\alpha/(m \cdot g + k \cdot L_f)$ to $\alpha/(m \cdot g + k \cdot L_d)$. Particularly, in this configuration example 1, the elastic body 24 is configured to have a natural length or a length longer than the natural length when the driving plate 20 is located at a position within the range of $L_f \leq x < 0$. Accordingly, within the range of $L_f \leq x < 0$, the elastic body 24 exerts a tensile force, so that an upward force is applied to the moving stage 16. Therefore, when the driving plate 20 is located at the position of x=$L_f$, the contact thermal resistance between the moving stage 16 and the cooling body 14 can be increased higher than a contact thermal resistance in case that the driving plate 20 is located at the position of x=0. Accordingly, in the temperature control device of the configuration example 1, it is possible to widen the control range of the contact thermal resistance.

Configuration Example 2

Figure 8A:
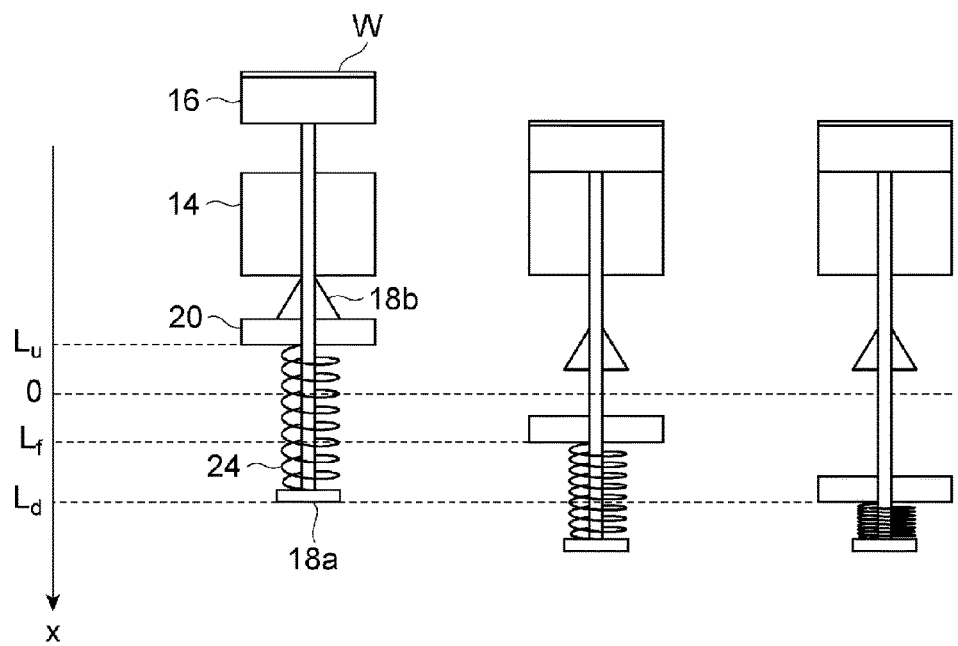
FIG. 8A is a diagram for describing a position of the driving plate in a configuration example 2 and FIG. 8B a diagram showing a relationship between a contact thermal resistance and the position of the driving plate in the temperature control device of the configuration example 2.

Now, the temperature control device of a configuration example 2 will be explained. In the configuration example 2, the temperature control device TC is designed such that the upper end of the elastic body 24 is connected to the bottom surface 20b of the driving plate 20 and the position $L_f$ is larger than zero (0) ($L_f > 0$). FIG. 8A is a schematic diagram illustrating states of the moving stage 16, the shaft 18 and the elastic body 24 when the driving plate 20 is located at the positions $L_u$, $L_f$ and $L_d$ on the x-axis in the temperature control device of the configuration example 2.

Figure 8B:
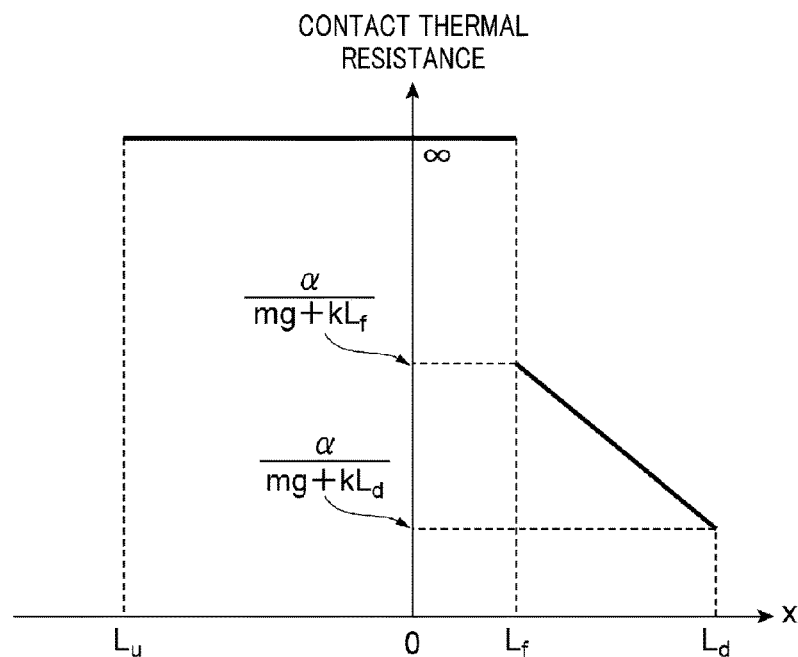

FIG. 8B shows a relationship between the position of the driving plate 20 and the contact thermal resistance in the configuration example 2. As depicted in FIG. 8A, in the configuration example 2, in case that the driving plate 20 is located at a position of $L_u \leq x < L_f$, the moving stage 16 is distanced apart from the cooling body 14. Accordingly, when the driving plate 20 is located at the position of $L_u \leq x < L_f$, the contact thermal resistance between the moving stage 16 and the cooling body 14 is substantially infinite as shown in FIG. 8B.

Further, in case that the driving plate 20 is located at a position of $L_f \leq x < L_d$, the elastic body 24 is elastically deformed, and a contact pressure dependent on the position of the driving plate 20 is generated between the moving stage 16 and the cooling body 14. This contact pressure is expressed as m·g+k·x[Pa/m²]. Accordingly, when the driving plate 20 is located within the range of $L_f \leq x < L_d$, the contact thermal resistance between the moving stage 16 and the cooling body 14 is indicated as α/(m·g+k·x)[K/W].

As can be seen from FIG. 8B, in the configuration example 2 as well, the contact thermal resistance between the moving stage 16 and the cooling body 14 can be linearly controlled within a range from α/(m·g+k·L_f) to α/(m·g+k·L_d). In this configuration example 2, as in the configuration example 1, the elastic body 24 is configured to have a natural length or a length longer than the natural length when the driving plate 20 is located at a position within the range of x<0. However, in this configuration example 2, the elastic body 24 is compressed to have a length shorter than the natural length when the position of the driving plate 20 is x=$L_f$. Accordingly, when the driving plate 20 is located within the range of $L_f \leq x \leq L_d$, the elastic body 24 always applies, to the moving stage 16, a load which may increase the contact pressure between the moving stage 16 and the cooling body 14. Thus, in the temperature control device of the configuration example 2, a control range of the contact thermal resistance is shortened as compared to the configuration example 1.

Configuration Example 3

Figure 9A:
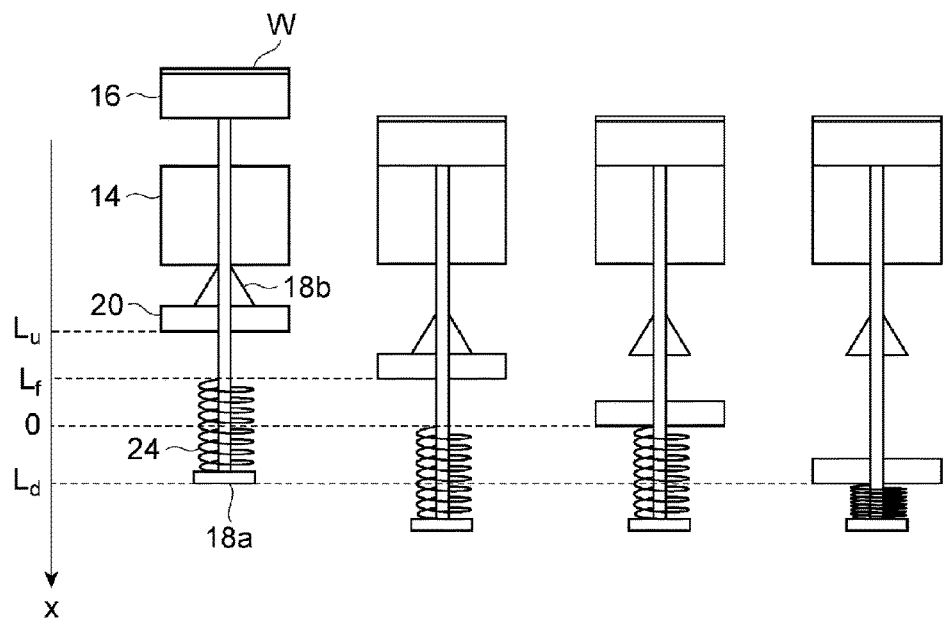
FIG. 9A is a diagram for describing a position of the driving plate in a configuration example 3 and FIG. 9B a diagram showing a relationship between a contact thermal resistance and the position of the driving plate in the temperature control device of the configuration example 3.

Now, the temperature control device of a configuration example 3 will be discussed. In the configuration example 3, the temperature control device TC is designed such that the upper end of the elastic body 24 is not connected to the bottom surface 20b of the driving plate 20 and the position $L_f$ is equal to or less than zero (0) ($L_f \leq 0$). FIG. 9A is a schematic diagram illustrating states of the moving stage 16, the shaft 18 and the elastic body 24 when the driving plate 20 is located at the positions $L_u$, $L_f$, 0 and $L_d$ on the x-axis in the temperature control device of the configuration example 3.

Figure 9B:
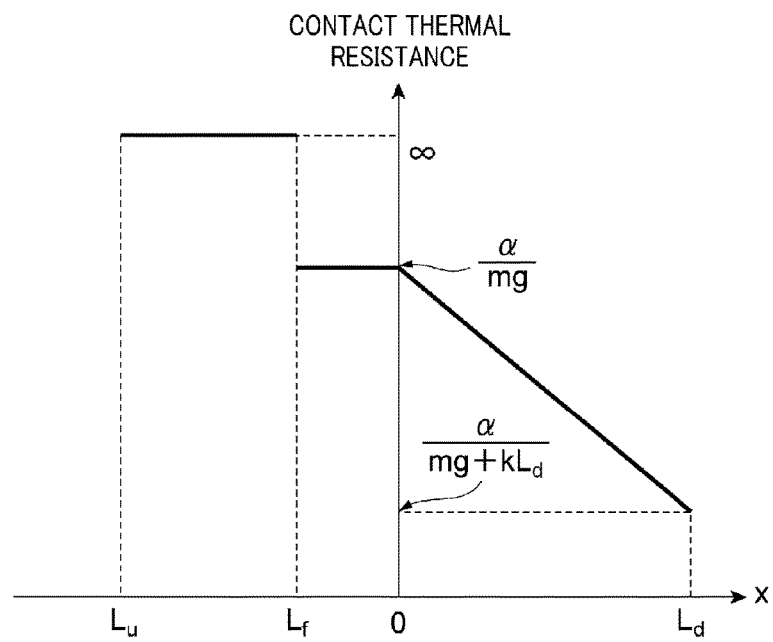

FIG. 9B shows a relationship between the position of the driving plate 20 and the contact thermal resistance in the configuration example 3. As depicted in FIG. 9A, in the configuration example 3, in case that the driving plate 20 is located at a position of $L_u \leq x < L_f$, the moving stage 16 is distanced apart from the cooling body 14. Accordingly, when the driving plate 20 is located at the position of $L_u \leq x < L_f$, the contact thermal resistance between the moving stage 16 and the cooling body 14 is substantially infinite as shown in FIG. 9B.

Further, in case that the driving plate 20 is located within a range of $L_f \leq x < 0$, the driving plate 20 is not in contact with the elastic body 24 though the moving stage 16 is in contact with the cooling body 14. Accordingly, even if the driving plate 20 is moved within the range of $L_f \leq x < 0$, the contact pressure between the moving stage 16 and the cooling body 14 is maintained at m·g[Pa/m²]. Therefore, when the driving plate 20 is located within the range of $L_f \leq x < 0$, the contact thermal resistance between the moving stage 16 and the cooling body 14 is indicated as (α/m·g)[K/W].

Furthermore, in case that the driving plate 20 is located within a range of $0 \leq x < L_d$, the elastic body 24 is elastically deformed, and a contact pressure dependent on the position of the driving plate 20 is generated between the moving stage 16 and the cooling body 14. This contact pressure is expressed as m·g+k·x[Pa/m²]. Thus, when the driving plate 20 is located within the range of $0 \leq x < L_d$, the contact thermal resistance between the moving stage 16 and the cooling body 14 is indicated by α/(m·g+k·x)[K/W]. As depicted in FIG. 9A and FIG. 9B, in the temperature control device of the configuration example 3, the contact thermal resistance between the moving stage 16 and the cooling body 14 can be controlled within a range from α/(m·g) to α/(m·g+k·L_d).

Configuration Example 4

Figure 10A:
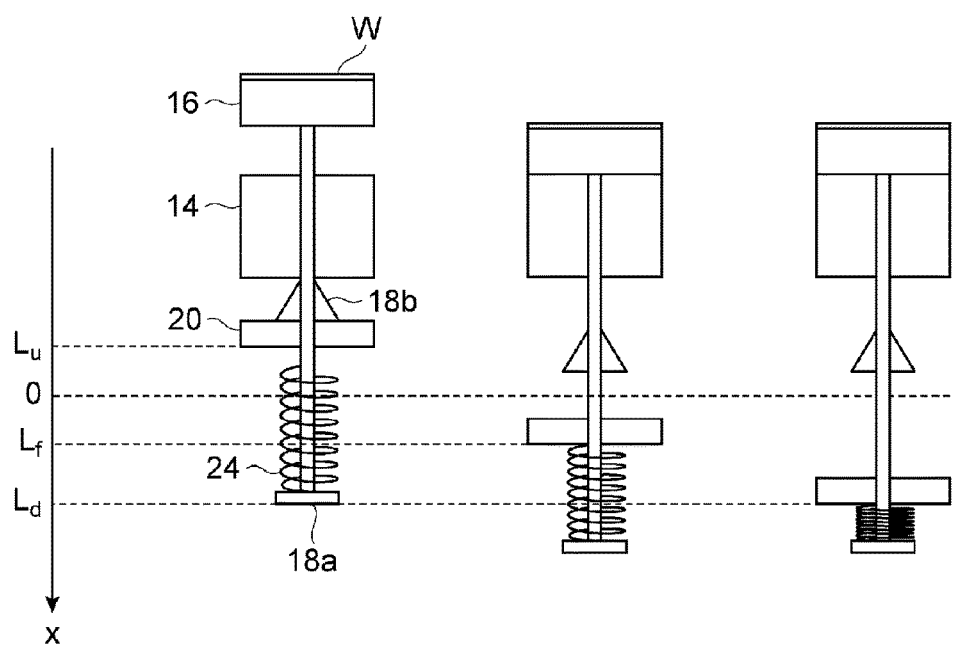
FIG. 10A is a diagram for describing a position of the driving plate in a configuration example 4 and FIG. 10B a diagram showing a relationship between a contact thermal resistance and the position of the driving plate in the temperature control device of the configuration example 4.

Now, the temperature control device of a configuration example 4 will be discussed. In the configuration example 4, the temperature control device TC is designed such that the upper end of the elastic body 24 is not connected to the bottom surface of the driving plate and the position $L_f$ is larger than zero (0) ($L_f > 0$). FIG. 10A is a schematic diagram illustrating states of the moving stage 16, the shaft 18 and the elastic body 24 when the driving plate 20 is located at the positions $L_u$, $L_f$ and $L_d$ on the x-axis in the temperature control device of the configuration example 4.

Figure 10B:
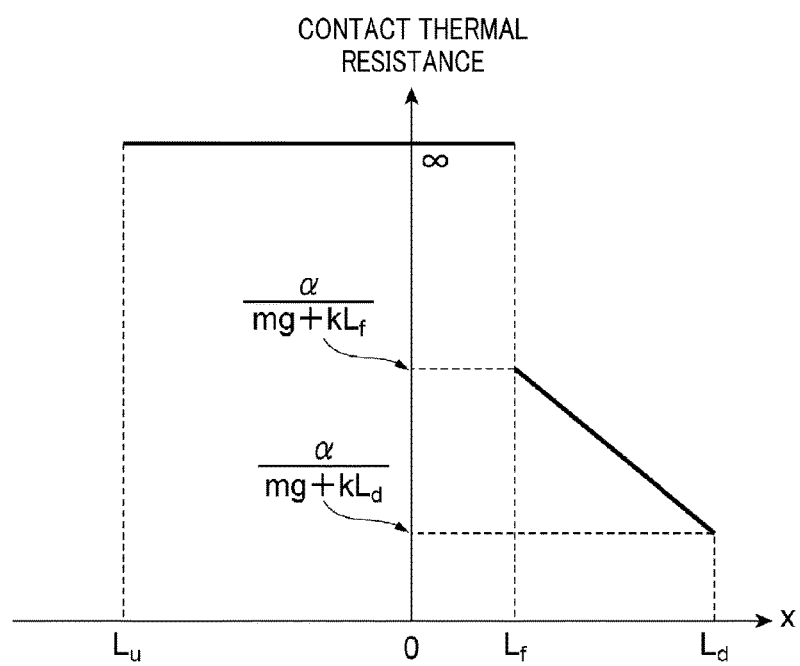

FIG. 10B shows a relationship between the position of the driving plate 20 and the contact thermal resistance in the configuration example 4. As depicted in FIG. 10A, in the configuration example 4, in case that the driving plate 20 is located at a position of $L_u \leq x < L_f$, the moving stage 16 is distanced apart from the cooling body 14. Accordingly, when the driving plate 20 is located at the position of $L_u \leq x < L_f$, the contact thermal resistance between the moving stage 16 and the cooling body 14 is substantially infinite as shown in FIG. 10B.

Further, in case that the driving plate 20 is located within a range of $L_f \leq x < L_d$, the elastic body 24 is elastically deformed, and a contact pressure dependent on the position of the driving plate 20 is generated between the moving stage 16 and the cooling body 14. This contact pressure is expressed as m·g+k·x[Pa/m²]. Accordingly, when the driving plate 20 is located within the range of $L_f \leq x < L_d$, the elastic body 24 delivers, to the moving stage 16, a load which may increase the contact pressure between the moving stage 16 and the cooling body 14. Thus, the contact thermal resistance between the moving stage 16 and the cooling body 14 is expressed as α/(m·g+k·x)[K/W].

As depicted in FIG. 10A and FIG. 10B, in the temperature control device of the configuration example 4, the contact thermal resistance between the moving stage 16 and the cooling body 14 can be controlled within a range from α/(m·g+k·L_f) to α/(m·g+k·L_d).

Further, in the aforementioned configuration examples 2 and 4 having the relationship of position $L_f > 0$, the control range of the contact thermal resistance can be adjusted by varying the elastic modulus k of the elastic body 24. Within a range where the contact thermal resistance is controllable linearly, a difference β between an upper limit and a lower limit of the contact thermal resistance is defined as Expression 1.

[Expression 1]

$$\beta = \frac{\alpha}{m \cdot g + k \cdot L_f} - \frac{\alpha}{m \cdot g + k \cdot L_d} \quad (1)$$

When $L_f>0$, if the elastic modulus k is set to satisfy the following Expression 2, the value of β in Expression 1 is maximized. That is, by designing the elastic modulus k of the elastic body 24 to meet the following Expression 2, the control range of the contact thermal resistance by the temperature control device TC can be maximized.

[Expression 2]

$$k = \frac{m \cdot g}{\sqrt{L_f \cdot L_d}} \quad (2)$$

As stated above, in the temperature control device TC, by moving the moving stage 16 upwards, the moving stage 16 can be spaced apart from the cooling body 14. If the moving stage 16 is distanced apart from the cooling body 14, the heat exchange between the moving stage 16 and the cooling body 14 is suppressed. Thus, by heating the moving stage 16 while maintaining the moving stage 16 spaced apart from the cooling body 14, the processing target object W can be heated rapidly.

Furthermore, in the temperature control device TC, by moving the moving stage 16 downwards, the moving stage 16 can be brought into contact with the cooling body 14. The contact pressure between the moving stage 16 and the cooling body 14 is adjusted according to the amount of the downward movement of the driving plate 20. Thus, by adjusting the amount of the downward movement of the driving plate 20, the amount of the heat exchange between the moving stage 16 and the cooling body 14 can be adjusted. Therefore, according to the temperature control device TC in the exemplary embodiment, the temperature control can be performed accurately.

In addition, in this temperature control device TC, in case that a difference between the temperature of the processing target object W and the target temperature is large, for example, the driving plate 20 may be controlled to decrease the contact thermal resistance. In case that the difference between the temperature of the processing target object W and the target temperature is small, on the other hand, the driving plate 20 may be controlled to increase the contact thermal resistance. Accordingly, the temperature of the processing target object W can reach the target temperature in a short time. Therefore, in case of performing a processing in which the heating and the cooling of the processing target object W are alternately repeated, for example, the throughput of the processing can be improved.

Figure 11:
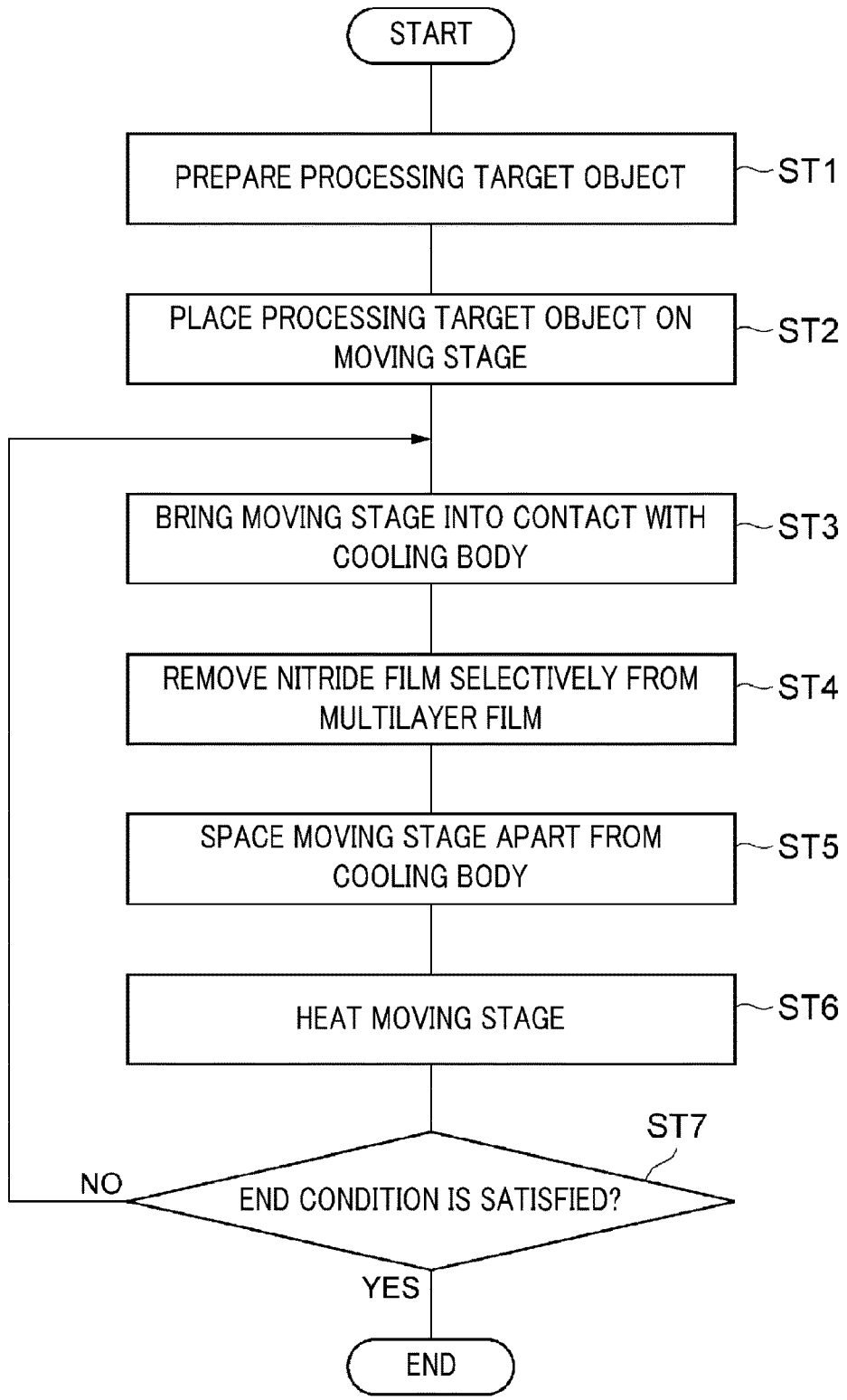
FIG. 11 is a flowchart for describing a method of selectively etching a nitride film from a multilayer film according to the exemplary embodiment.

Now, a method of processing the processing target object by using the plasma processing apparatus 10 shown in FIG. 1 will be explained. In the following, a method of selectively etching a nitride film from a multilayer film will be described as an example method of processing the processing target object by the plasma processing apparatus 10. FIG. 11 is a flowchart for describing a method MT of selectively etching a nitride film from a multilayer film according to the exemplary embodiment. The method MT is a part of a manufacturing process of a 3D NAND device.

Figure 12:
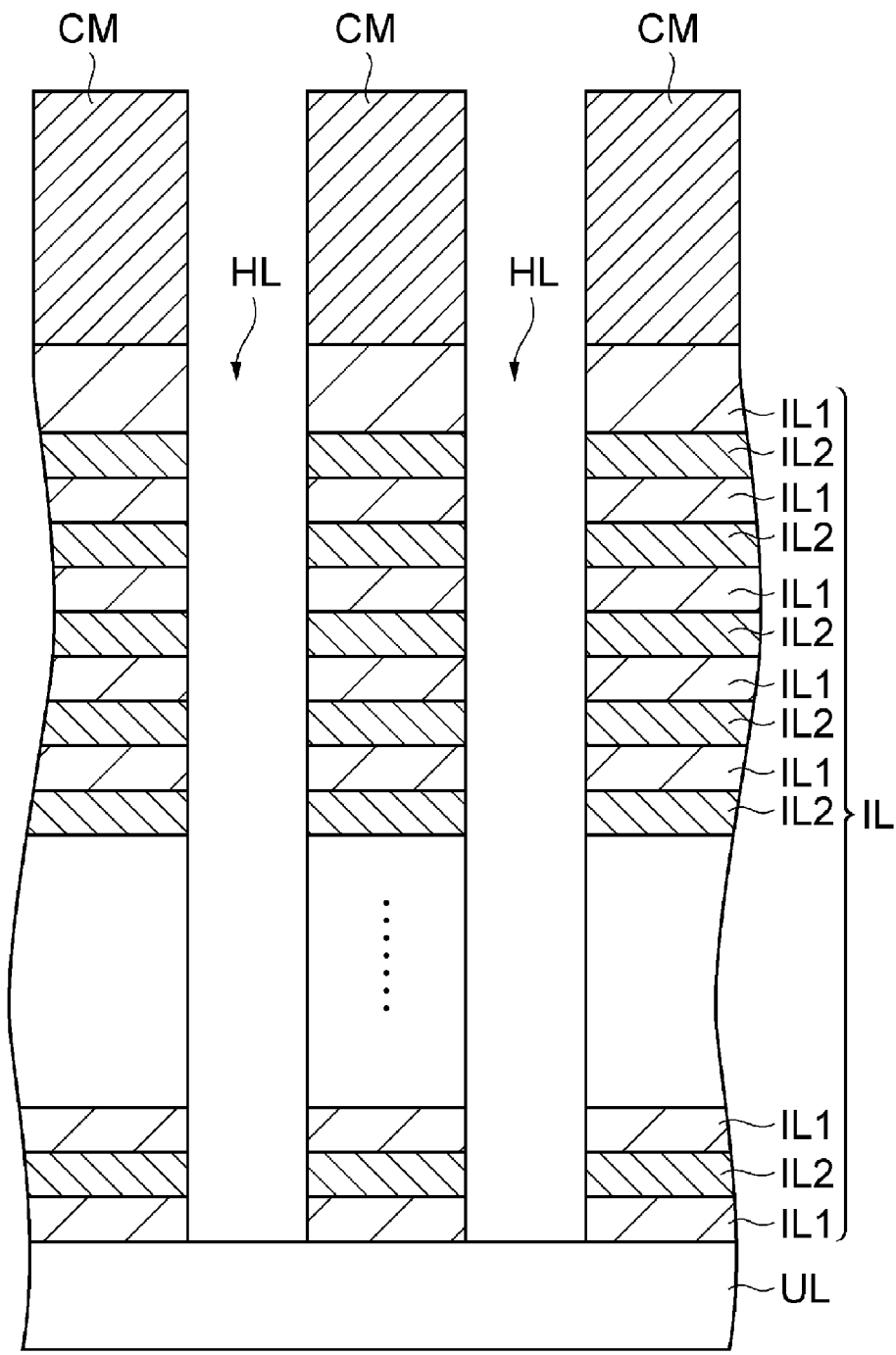
FIG. 12 is a diagram showing an example of a processing target objet which is prepared in a process ST1.

In the method MT, a process ST1 is first performed. In the process ST1, the processing target object W is prepared. FIG. 12 illustrates an example of the processing target object W prepared in the process ST1. The processing target object W shown in FIG. 12 has an underlying layer UL, a multilayer film IL and a mask CM. The underlying layer UL may be, by way of example, a polycrystalline silicon layer provided on a substrate. The multilayer film IL is provided on the underlying layer UL. The multilayer film IL has a structure in which a first film IL1 as an oxide film and a second film IL2 as a nitride film are stacked alternately on top of each other. According to the exemplary embodiment, the first film IL1 may be a silicon oxide film, and the second film IL2 may be a silicon nitride film. Further, the multilayer film IL may be provided with a supporting body which is extended in a stacking direction and supports the first film IL1 when the second film IL2 is etched. The mask CM may be provided on the multilayer film IL.

Further, the multilayer film IL is etched under an opening of the mask CM, and a hole HL is formed in the multilayer film to reach a surface of the underlying layer UL. For example, this hole HL may be formed by plasma-etching the multilayer film IL via the mask CM.

In a subsequent process ST2, the processing target object W prepared in the process ST1 is placed on the top surface of the moving stage 16. In a process ST3, the driving plate 20 is moved downwards, and the moving stage 16 is brought into contact with the cooling body 14. As a result, the heat transfer between the moving stage 16 and the cooling body 14 occurs, so that the moving stage 16 is cooled. At this time, by adjusting the amount of the downward movement of the driving plate 20, the moving stage 16 can be controlled to have the target temperature. As a result, the processing target object W on the moving stage 16 is cooled.

Figure 13:
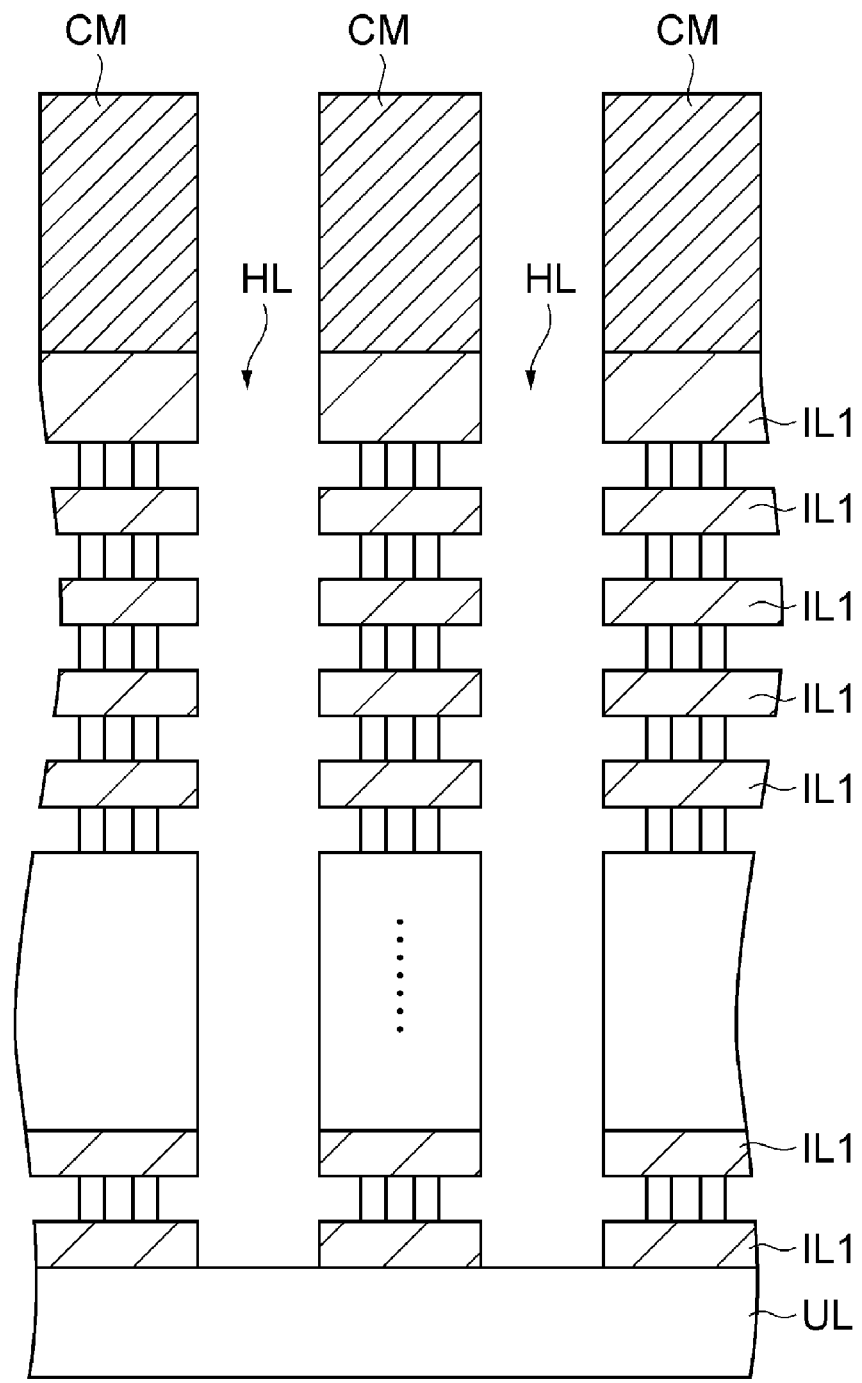
FIG. 13 is a diagram showing the processing target object after a second film is etched in a process ST4.

Then, a process ST4 is performed. In the process ST4, a processing gas is supplied from the gas supply unit 42, and plasma of the processing gas is generated within the processing vessel 12. This processing gas contains fluorine and hydrogen. The second film IL2 is selectively etched from the multilayer film IL by, for example, active species of the fluorine and active species of the hydrogen. FIG. 13 illustrates an example of the processing target object W in which the second film IL2 is selectively etched from the multilayer film IL through the process ST4.

Figure 14:
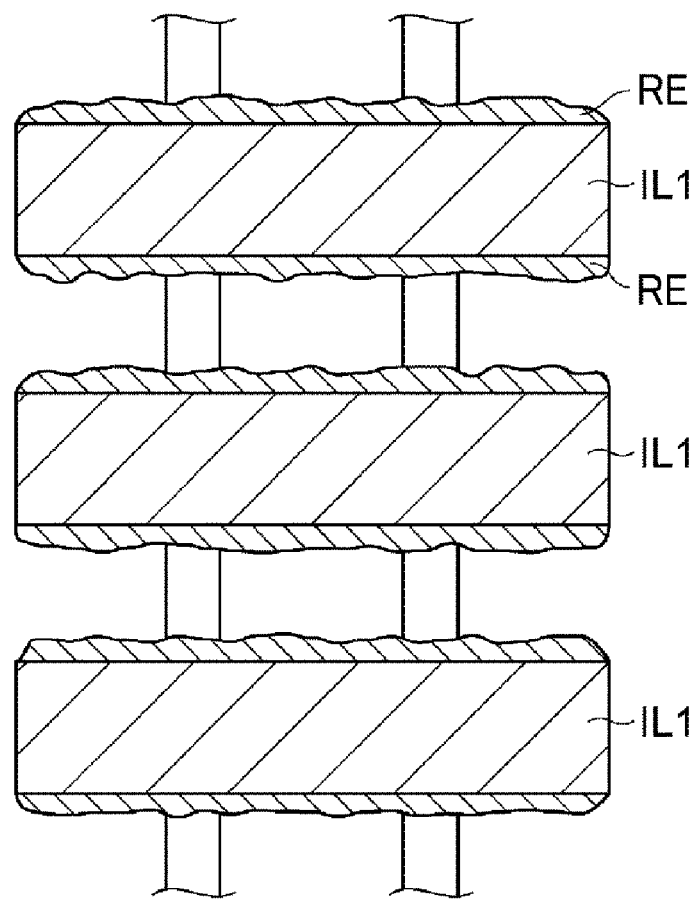
FIG. 14 is a diagram showing a residue adhering to the multilayer film in the process ST4.

In this process ST4, when the second film IL2 is etched by using the processing gas, the material of the second film IL2 reacts with the processing gas, and a reaction product is generated. This reaction product adheres to the first film IL1 and remains as a residue RE in a space which is formed by removing the second film IL2, as shown in FIG. 14. If this residue RE remains, when filling the space in which the second film IL2 is removed with an electrode layer in a post-process of the method MT, for example, the electrode layer may not be filled uniformly.

Referring back to FIG. 11, a process ST5 is subsequently performed in the method MT. In the process ST5, by moving the driving plate 20 upwards, the moving stage 16 is spaced apart from the cooling body 14. Then, in a process ST6, while keeping the moving stage 16 distanced apart from the cooling body 14, the moving stage 16 is heated by the heater HT until the residue RE is evaporated. For example, in the process ST6, the moving stage 16 is heated up to 200° C. As a consequence, the residue RE adhering to the first film IL1 is evaporated and is exhausted out of the processing vessel 12 through the gas exhaust line 52. Through this process ST6, the residue RE is removed from the processing target object W.

Subsequently, in a process ST7, it is determined whether an end condition is satisfied. If it is determined in the process ST7 that the end condition is not satisfied, the processes ST3 to ST6 of the method MT are repeated. If the end condition is found to be satisfied, on the other hand, the method MT is ended.

As stated above, in the method MT, the process of cooling the processing target object W and the process of heating the processing target object W are repeated alternately. By performing this method MT with the temperature control device TC according to the exemplary embodiment, it is possible to perform both the cooling and the heating of the processing target object W within the same plasma processing apparatus. Therefore, the throughput of the processing target object W can be improved. Furthermore, according to the temperature control device TC, when cooling the processing target object W, since a time required to allow the temperature of the processing target object W to reach the target temperature can be shortened, the processing throughput of the processing target object W can be further improved.

In the above, the various exemplary embodiments have been described. However, the exemplary embodiments are not limiting, and various changes and modifications may be made. For example, in the above-described exemplary embodiments, the temperature control device is applied to an inductively coupled plasma etching apparatus. However, the apparatus to which the temperature control device is applied is not limited to the inductively coupled plasma etching apparatus. By way of non-limiting example, the temperature control device may also be applicable to a plasma processing apparatus using a microwave, a capacitively coupled parallel plate type plasma etching apparatus, and so forth.

Furthermore, in the exemplary embodiments, a heat transfer sheet may be provided between the moving stage 16 and the cooling body 14. This heat transfer sheet is a sheet-shaped member made of a material having a high thermal conductivity, and may be, for example, a silicon-based resin sheet. By providing this heat transfer sheet between the moving stage 16 and the cooling body 14, the contact thermal resistance between the moving stage 16 and the cooling body 14 can be reduced. Therefore, according to this configuration, the processing target object W can be heated or cooled more rapidly.

EXPLANATION OF REFERENCE NUMERALS

10: Plasma processing apparatus
12: Processing vessel
14: Cooling body
14c: Through hole
14h: Through hole
15: Coolant path
16: Moving stage
18: Shaft
18a: First flange
18b: Second flange
20: Driving plate
20a: Top surface
20b: Bottom surface
20h: Through hole
22: Driving unit
24: Elastic body
26: Chiller unit
28: Electrode
30: Driving shaft
42: Gas supply unit
50: Gas exhaust unit
52: Gas exhaust line
60: High frequency antenna
70A: High frequency power supply
70B: High frequency power supply
80: Shield member
100: Control unit HP: Heater power supply
HT: Heater
IL: Multilayer film
IL1: First film (oxide film)
IL2: Second film (nitride film)
S: Processing space
TC: Temperature control device
UL: Underlying layer
W: Processing target object
Z: Axis line

We claim:

1. A temperature control device for a processing target object, comprising:
a moving stage allowed to be heated and configured to mount a processing target object on a top surface thereof;
a cooling body allowed to be cooled and fixed at a position under the moving stage;
a shaft, having one end connected to the moving stage; the other end positioned under the cooling body; a first flange provided at the other end; and a second flange provided between the first flange and the cooling body, extended between the one end and the other end;
a driving plate, provided between the first flange and the second flange, having a top surface facing the second flange and a bottom surface opposite to the top surface;
an elastic body provided between the bottom surface of the driving plate and the first flange;
a driving unit configured to move the driving plate up and down; and
a control unit configured to control the driving unit,
wherein the control unit is configured to adjust a contact thermal resistance between the moving stage and the cooling body by adjusting an amount of a downward movement of the driving plate, and
wherein an amount of compression of the elastic body is adjusted as the amount of downward movement on the driving plate is adjusted.

2. The temperature control device of claim 1,
wherein the elastic body is a coil-shaped spring, and
the spring is configured to have a natural length or a length longer than the natural length when the driving plate is located at an uppermost position.

3. The temperature control device of claim 1,
wherein the driving unit comprises:
a driving shaft extended in a vertical direction and connected to the driving plate; and
a motor configured to move the driving shaft such that the driving plate is moved up and down.

4. The temperature control device of claim 1,
wherein the moving stage includes a heater.

5. The temperature control device of claim 1,
wherein a path for a coolant is formed within the cooling body.

6. A method of selectively etching a nitride film from a processing target object, which has a multilayer film in which an oxide film and the nitride film are alternately stacked on top of each other, by using a temperature control device comprising a moving stage allowed to be heated and configured to mount a processing target object on a top surface thereof; a cooling body allowed to be cooled and fixed at a position under the moving stage; a shaft, having one end connected to the moving stage; the other end positioned under the cooling body; a first flange provided at the other end; and a second flange provided between the first flange and the cooling body, extended between the one end and the other end; a driving plate, provided between the first flange and the second flange, having a top surface facing the second flange and a bottom surface opposite to the top surface; an elastic body provided between the bottom surface of the driving plate and the first flange; and a driving unit configured to move the driving plate up and down, the method comprising:

placing the processing target object on the top surface of the moving stage;

bringing the moving stage into contact with the cooling body by moving the driving plate downwards;

adjusting a contact thermal resistance between the moving stage and the cooling body by adjusting an amount of a downward movement of the driving plate;

etching the nitride film selectively from the multilayer film by plasma of a processing gas containing fluorine and hydrogen after the bringing of the moving stage into contact with the cooling body;

spacing the moving stage apart from the cooling body by moving the driving plate upwards after the etching of the nitride film; and removing a reaction product, which is generated in the etching of the nitride film, by heating the moving stage after the spacing of the moving stage apart from the cooling body.

* * * * *